(12) United States Patent  (10) Patent No.: US 7,219,286 B2
Morgan  (45) Date of Patent: May 15, 2007

(54) BUILT OFF SELF TEST (BOST) IN THE KERF

(75) Inventor: Alan Morgan, Munich (DE)

(73) Assignee: Infineon Technologies AG, Munich ( * ) Notice: Subject to any disclaimer, the term of this patent is extended or adjusted under 35 U.S.C. 154(b) by 663 days.

(21) Appl. No.: 10/154,476

(22) Filed: May 22, 2002

(65) Prior Publication Data

US 2003/0066040 A1    Apr. 3, 2003

(30) Foreign Application Priority Data

May 22, 2001  (DE) ................. 101 25 029

(51) Int. Cl.
G01R 31/28 (2006.01)
(52) U.S. Cl. ................... 714/733; 324/765
(58) Field of Classification Search ............ 714/724, 714/733, 727, 734; 324/754, 755, 761, 763, 324/765; 438/17
See application file for complete search history.

(56) References Cited

U.S. PATENT DOCUMENTS 3,849,872 A   11/1974  Hubacher .............. 29/574
5,214,657 A *  5/1993  Farnworth et al. ........... 714/767
5,899,703 A    5/1999  Kalter et al. .................. 438/18
6,366,110 B1   4/2002  Buck .......................... 324/765
6,489,791 B1* 12/2002  Tsujii .......................... 324/755
6,730,529 B1*  5/2004  Kalter et al. .................. 438/17
2001/0022360 A1 9/2001 Richter ....................... 257/48

FOREIGN PATENT DOCUMENTS

| DE | 3724144 | 2/1989 |
| DE | 199 17 586 | 2/2000 |
| JP | 2000323539 A | 11/2000 |
| JP | 2001085479 A | 3/2001 |

* cited by examiner

Primary Examiner—James C Kerveros
(74) Attorney, Agent, or Firm—Fish & Richardson P.C.

(57) ABSTRACT

A semiconductor device includes an integrated main circuit and an auxiliary circuit on a semiconductor substrate. The auxiliary circuit is configured to output and/or for receive electrical signals to and/or from the main circuit and is arranged at a distance from the main circuit in a kerf region of the semiconductor device. The main and auxiliary circuits each include a contact device that can be externally contact-connected to produce a temporary electrical signal connection between the main and auxiliary circuits.

14 Claims, 2 Drawing Sheets

BUILT OFF SELF TEST (BOST) IN THE KERF

RELATED APPLICATIONS

This application claims the benefit of the May 22, 2001 priority date of German application 101 25 029.0-33, the contents of which are herein incorporated by reference.

FIELD OF INVENTION

The invention relates to semiconductor devices.

BACKGROUND

In past years, integrated semiconductor circuits, in particular memory components, have been able to be embodied with ever higher levels of integration by virtue of planar-lithographic patterning methods that have continually been improved further, so that the required chip sizes have been able to be reduced. These so-called "shrinks" have enabled semiconductor circuits to be produced more and more cost-effectively. Equally, however, the production process for such integrated semiconductor circuits has become more complex, whereby testing of the semiconductor circuits produced is acquiring ever greater importance. In order to test memory components, in particular DRAMs, a widespread procedure is to integrate self-test structures on the memory chip. Such self-test structures, which are also referred to as built-in self-test (BIST), simplify and accelerate the functional test method for the memory module to a significant extent.

However, the integration of such BIST structures on the memory chip leads to an enlargement of the required chip area which gives rise to cost disadvantages in production.

SUMMARY

It is an object of the invention to specify a semiconductor device having an integrated main circuit, in particular a memory circuit, and an integrated auxiliary circuit, in particular a test circuit, in which the chip area required for the main circuit can be reduced. Furthermore, it is an object of the invention to specify a corresponding method for operating, in particular testing, a main circuit of a semiconductor device.

A semiconductor device according to the invention comprises
  at least one integrated main circuit on a semiconductor substrate and
  at least one integrated auxiliary circuit on the semiconductor substrate, which is designed for outputting and/or for receiving electrical signals to and/or from the main circuit and is arranged at a distance from the main circuit in a kerf region of the semiconductor device, wherein the main and auxiliary circuits in each case comprise at least one contact device, which can be externally contact-connected in order to produce at least one temporary electrical signal connection between the main and auxiliary circuits.

The invention thus proposes that the integrated auxiliary circuit, which may be a self-test structure, for example, is not produced together with the main circuit on the semiconductor chip that is later to be sold, but rather is accommodated outside this region. According to the invention, the auxiliary circuit is accommodated in the so-called kerf region of the semiconductor device. The kerf region is that region which lies outside the actual chip area that makes up the chips that are later to be sold, and which constitutes, in particular, the cutting region for later sawing and/or grinding of the semiconductor wafer in order to separate the individual chips.

Consequently, the kerf region constitutes a required waste region of the semiconductor device in which, admittedly, no main circuits can be accommodated but which is required, in particular, for later sawing of the semiconductor device.

Since the finished semiconductor chip containing the main circuit need not in many cases include the auxiliary circuit, since the latter is, for example, a self-test structure that is required only during the test operation, it is possible to accommodate said auxiliary circuit in the kerf region, so that, for example, a so-called built-off self-test (BOST) can be integrated in the kerf region.

It has been conventional practice to accommodate in the kerf region only test structures which are used, in particular, for monitoring the planar-lithographic processes to which the semiconductor device has been subjected. These test structures are electrical components which are not designed for outputting or for receiving electrical signals to or from the main circuit.

In order to enable an (electrically active) auxiliary circuit to be produced in the kerf region without increasing the failure rate of the chips to be sold with the main circuit, the invention proposes that the auxiliary circuit is arranged spatially spaced apart from the main circuit in the kerf region and contact devices for a temporary electrical signal connection are in each case provided in the main and auxiliary circuits. The contact devices of the main and auxiliary circuits allow a contact between auxiliary and main circuits to be temporarily produced by means of an external device (for example a test head). When the electrical signal connection between main and auxiliary circuits is no longer required, for example because the testing of the main circuit by the auxiliary circuit is concluded, this temporary signal connection can be interrupted or removed again.

Accordingly, in a semiconductor device according to the invention, there are no planar-lithographically defined metal tracks which connect the main circuit to the auxiliary circuit. This is because such metal tracks (typically aluminum tracks) could lead to problems to be taken seriously in the course of later sawing of the semiconductor device for the purpose of separating the main circuit from the auxiliary circuit. If such an aluminum track were provided, then sawing of the semiconductor device could lead, in particular on account of the ductile properties of the aluminum, to short-circuiting of different interconnects at the chip or sawing edges. Furthermore, the chip edges would have unpassivated aluminum structures in such a case, which could jeopardize the long-term stability of the chips to be sold. However, together with the concept of the temporary electrical signal connection, the spatial distance provided between the main and auxiliary circuits, which is provided according to the invention in a semiconductor device, ensures that such a new failure mechanism described above will not occur.

The integration of the auxiliary circuit in the otherwise largely unused kerf region of the semiconductor device makes it possible for the chip area required for the main circuit to be appreciably reduced without having to enlarge the kerf region for the auxiliary circuit. Thus, the minimum size of the kerf region between individual main circuits of the semiconductor device is primarily determined by the sawing cut width of the mechanical sawing process used.

Thus, the minimum kerf region that can technically be realized typically always has a size which affords enough space even for complex auxiliary circuits with thousands of transistors.

In accordance with one preferred embodiment, the main circuit is isolated from the auxiliary circuit by a trench, the bottom of which is preferably formed by the semiconductor substrate. As an alternative, the bottom of the trench can also be formed by one or more insulator layers which have no disadvantageous influence on the later sawing. During the later sawing process, a cut edge is guided such that it is located in the trench. The auxiliary circuit is preferably completely removed and destroyed during the sawing process.

In accordance with a further preferred embodiment, the distance between the main and auxiliary circuits is at least 20 µm, preferably at least 40 µm. The magnitude of the distance primarily depends on the tolerance or guidance accuracy of the sawing process used.

In accordance with a further preferred embodiment, the contact device of the main circuit comprises at least one electrical terminal pad of the main circuit. Such a terminal pad may be a bonding pad of the main circuit, which pad is used during later contact-connection of said main circuit. Consequently, it is not necessary to provide an additional contact device that is not used in later operation of the main circuit.

In accordance with a further embodiment, the contact device of the main circuit comprises at least one redistributed contact which is electrically connected to an electrical terminal pad of the main circuit. Such a redistributed contact can be designed specifically for simplifying the production of the temporary signal connection. In this case, it is possible to resort, in particular, to the technology of so-called "wafer-level packaging", in which such "redistributed contacts" are regularly used.

In accordance with a further preferred embodiment, the contact devices of the main and auxiliary circuits are of elastic design. Such an elastic design ensures an electrically reliable contact between an external device and the contact devices of the semiconductor device even when contact is to be made simultaneously with a multiplicity of contact devices. A sufficient contact pressure between the contact device and the external device is thus possible even in the case of such simultaneous contact-connection.

Preferably, the contact device comprises electrically conductive, elastic contact means, in particular metalized contact bodies and/or microsprings. With regard to the configuration of such elastic contact devices, it is possible to resort to the technology known from "wafer-level packaging" (WLP).

In accordance with a further preferred embodiment, at least two of the main circuits are provided and the at least one auxiliary circuit is designed for outputting and/or for receiving electrical signals to and/or from the main circuits. Consequently, the auxiliary circuit accommodated in the kerf region of the semiconductor device is assigned at least two main circuits. However, it is equally possible for three or more main circuits also to be allocated to an auxiliary circuit. In this case, the auxiliary circuit is designed to output electrical signals to the multiplicity of allocated main circuits and/or to receive said signals from said main circuits. By virtue of the fact that, in accordance with this embodiment, only a single auxiliary circuit has to be allocated to a plurality of main circuits, the space required in the kerf region of the semiconductor device for the auxiliary circuit can be reduced. At the same time, the parallelization effected by allocation of the multiplicity of main circuits to the auxiliary circuit enables simpler and faster access to the semiconductor device. By way of example, if the auxiliary circuit is electrically connected to an external signal head during the production of the temporary electrical signal connection, then preferably all of the allocated main circuits can be addressed via this connection.

In accordance with a further preferred embodiment, the contact devices of the at least two main circuits and the at least one auxiliary circuit can be externally contact-connected in such a way that the temporary electrical signal connections can be produced simultaneously between the main circuits and the auxiliary circuit. In this case, it is not absolutely necessary for the temporary electrical signal connections to be produced—for example by moving a signal head into proximity—at an exactly identical instant. Rather, it is sufficient and desirable for all the temporary electrical signal connections between the at least two main circuits and the allocated auxiliary circuit to be present simultaneously or at the same time even if they are created not at the same time but only sequentially. Such a design of the contact devices enables simpler and faster production of the—under certain circumstances large—number of electrical temporary signal connections, thereby enabling simpler access to the semiconductor device.

In accordance with a further preferred embodiment, the at least one auxiliary circuit is formed in the kerf region between the two main circuits, which are arranged adjacent. The auxiliary circuit allocated to a pair of main circuits is thus located in the kerf region which isolates said main circuits from one another, thereby enabling in particular short signal paths of the temporary signal connections that are to be produced.

In accordance with a further preferred embodiment, the at least one main circuit and the at least one auxiliary circuit are designed for the simultaneous production of the at least one signal connection by means of an electrical signal head, in particular a test head. Accordingly, the main and auxiliary circuits have such contact devices which enable an electrical contact with a signal head that is to be brought into proximity for the purpose of producing the temporary signal connections. As has already been explained above, it is not necessary for all of the temporary signal connections to be produced at the same instant, merely that—after a specific contact production phase—all the temporary signal connections are present at the same time.

In accordance with a particularly preferred embodiment, at least two of the auxiliary circuits are provided, which are designed for the joint utilization of a control or driver device of the signal head. Accordingly, the semiconductor device comprises a multiplicity of auxiliary circuits which are constructed in such a way that they can be electrically addressed by a single control or driver device of the signal head. This makes it possible for a multiplicity of auxiliary circuits to be electrically addressed via a single driver device. Each of the auxiliary circuits can be connected to at least one of the main circuits via a temporary electrical signal connection. However, a cascaded arrangement of driver devices, auxiliary and main circuits is particularly preferred: in this case, by way of example, two auxiliary circuits of the semiconductor device are driven by a single driver device of the signal head. Each of these auxiliary circuits is in turn connected to a multiplicity of the main circuits via temporary electrical signal connections that are to be created, so that a large number of main circuits can be addressed in parallel (and thus simply and in a manner that saves time) by means of a single driver device.

In accordance with a particularly preferred embodiment, the at least one auxiliary circuit is a test circuit, in particular a so-called "built-off self-test" (BOST), which is designed for testing the main circuit.

In accordance with a particularly preferred embodiment, the at least one main circuit is a memory circuit, in particular a DRAM.

A method according to the invention for operating, in particular testing, a main circuit of a semiconductor device in particular according to the invention comprises the following steps in this order:

provision of the semiconductor device having at least the one integrated main circuit and at least one integrated auxiliary circuit on a semiconductor substrate, the auxiliary circuit being arranged at a distance from the main circuit in a kerf region of the semiconductor device;

production of at least one temporary electrical signal connection between at least one contact device of the main circuit and at least one contact device of the auxiliary circuit;

outputting and/or reception of electrical signals to and/or from the main circuit by the auxiliary circuit; and interruption of the temporary signal connection.

Since the electrical signal connection is removed again before the sawing of the semiconductor device, there is no need to fear failures of main circuits in particular on account of unpassivated metal edges or short circuits at the chip edges. Auxiliary circuits which do not have to be sold to the customer with the actual main circuit can thus be integrated in the semiconductor device in a manner that saves chip area.

In accordance with a further preferred embodiment, the production of the at least one temporary signal connection is effected by contact-connection of the contact device to an electrical signal head, in particular a test head. The electrical contact between the main-circuit contact device and the auxiliary-circuit contact device is thus produced by moving into proximity and contact-connecting these contact devices to a signal head designed therefor, which can simultaneously feed a detected signal to an external unit for the purpose of further processing and evaluation.

In accordance with a further preferred embodiment, the semiconductor device comprises at least two of the main circuits and the at least one auxiliary circuit is designed for receiving and/or for outputting electrical signals to the two main circuits. Consequently, an auxiliary circuit accommodated in the kerf region of the semiconductor device is allocated a multiplicity of main circuits which can be connected thereto via a temporary electrical signal connection. In order thus to be able to address a predetermined number of main circuits, on account of the jointly utilized auxiliary circuit, less chip area is required in the kerf region of the semiconductor device, so that the unused kerf region can be supplied for other uses.

In accordance with a further preferred embodiment, the temporary electrical signal connections are produced simultaneously between the main circuits and the at least one auxiliary circuit. While it would be possible to connect the auxiliary circuit sequentially to a series of main circuits in such a way that the auxiliary circuit is in each case in electrical signal connection to exactly one of the main circuits, it is advantageous to configure the main and auxiliary circuits in such a way that the electrical, temporary signal connections can be produced simultaneously. Consequently, the at least one auxiliary circuit can electrically address a multiplicity of the main circuits at the same time via the temporary signal connection created.

In accordance with a further preferred embodiment, the semiconductor device comprises at least two of the auxiliary circuits, which are designed for the joint utilization of a driver device or a control device of the signal head. Consequently, consequently the driving of the auxiliary circuit which outputs and/or receives the electrical signals to and/or from the main circuit is preferably effected by a jointly utilized driver device provided on the signal head. This allocation of a variety of auxiliary circuits to a single driver device enables a parallelization in the operation of the semiconductor device according to the invention, which allows a more time-efficient driving of a multiplicity of main circuits. It is particularly preferred for methods according to the invention to be operated in a cascaded embodiment. In this case, at least two auxiliary circuits share a single driver device of the signal head. These auxiliary circuits are in turn designed to be connected in each case to a multiplicity of the main circuits via temporary electrical signal connections that are to be created. This makes it possible to use a single signal head or a single driver device to address a multiplicity of the auxiliary circuits, which can in turn be connected to a multiplicity of main circuits. The parallelization achieved as a result of this means that, in particular, test operations of the main circuits can be carried out simply and in a manner that saves time.

In accordance with a further preferred embodiment, the at least one main circuit is a memory circuit, in particular a DRAM, and the auxiliary circuit is a test circuit, the step of outputting and/or receiving the electrical signals comprising the testing of the memory circuit by means of the auxiliary circuit. Consequently, with a reduced chip area of the memory circuit, a full functional test by means of the BOST is nevertheless possible.

In accordance with a further embodiment of the method according to the invention, in order to separate the main circuit from the auxiliary circuit, the semiconductor device is severed in the kerf region.

The concluding severing of the semiconductor device in order to separate the main circuit (to be sold) from the rest of the semiconductor device is effected, according to the invention, only when the temporary signal connection has been removed again. Consequently, it is possible, in a semiconductor device, to accommodate electrically active auxiliary circuits in the (otherwise largely unused) kerf region and electrically connect them temporarily to the main circuit, in particular during a wafer-level testing.

In accordance with a preferred embodiment of the method according to the invention, the severing of the semiconductor device comprises the complete removal and destruction of the auxiliary circuit. The cut edge of the sawing process used is accordingly positioned in such a way that it runs between the main and auxiliary circuits and thus completely removes the auxiliary circuit.

BRIEF DESCRIPTION OF THE FIGURES

The invention is described by way of example below with reference to the accompanying drawing, in which.

DETAILED DESCRIPTION

Figure 1:
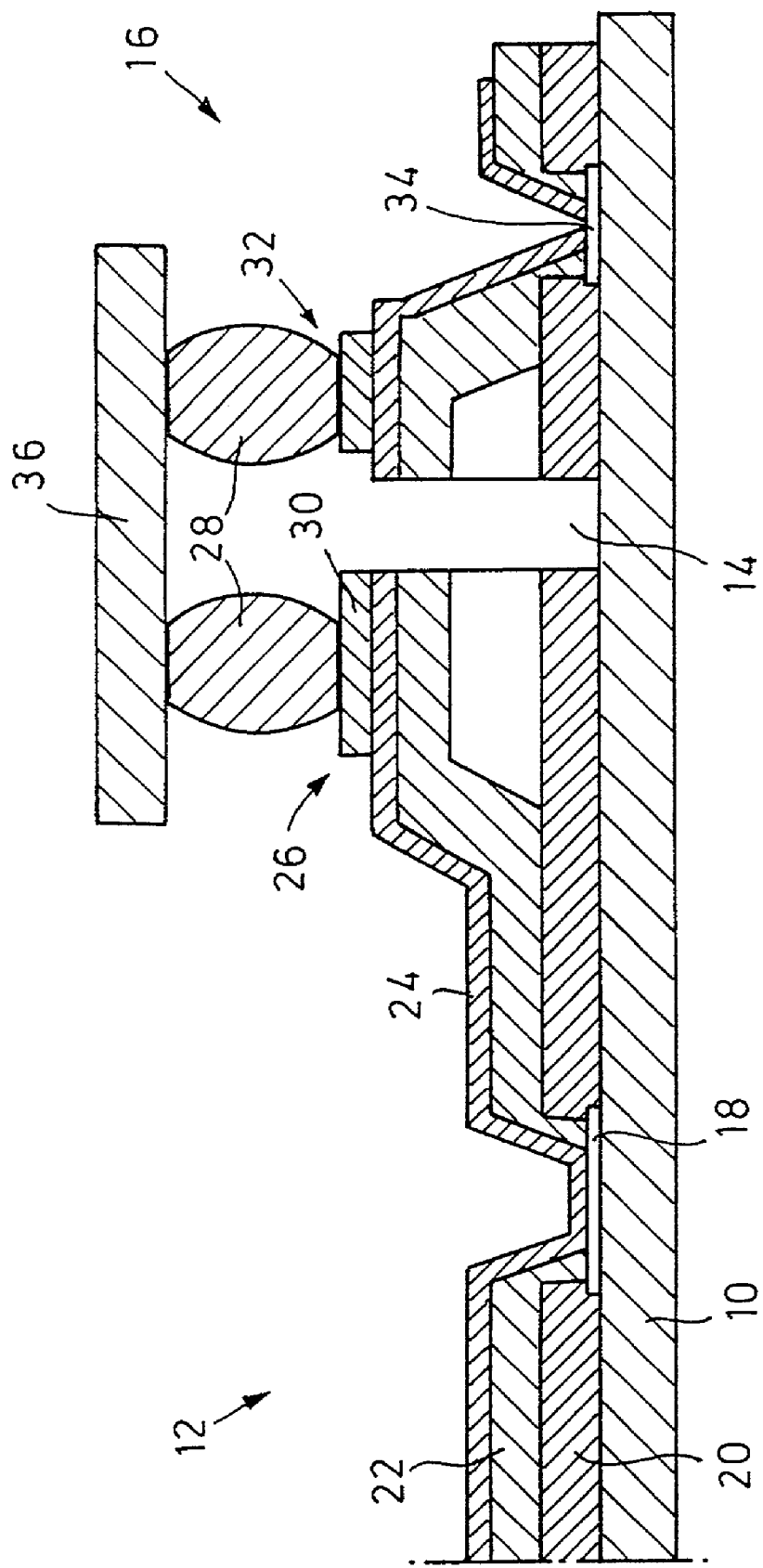
FIG. 1 shows a diagrammatic sectional view of a partial region of an embodiment of a semiconductor device according to the invention with main circuit and auxiliary circuit.

FIG. 1 illustrates a diagrammatic sectional view of a semiconductor device according to the invention. An integrated main circuit 12, in this case a DRAM memory, has been produced on a silicon substrate 10 in a customary manner by means of planar-lithographic process techniques. Only a small part of the main circuit 12 is visible. An auxiliary circuit 16, which constitutes a self-test structure (a so-called "built-off self-test" (BOST)) is spatially spaced apart from the main circuit 12 by a trench 14.

The main circuit, whose edge region is illustrated only in a very simplified fashion in cross section, has a terminal pad 18, which is a bonding pad for contact-connection of the main circuit for later operation. Applied on a passivation layer 20, preferably an SiN passivation layer, and an additional dielectric layer 22 there is an interconnect 24, preferably an aluminum track or copper track, which is electrically conductively connected to the terminal pad 18 of the main circuit 12. The interconnect 24 redistributes the contact of the terminal pad 18 to a main-circuit contact device 26. The contact device 26 is of elastic design and comprises an electrically conductive, metalized contact body 28, which is conductively connected to the interconnect 24 via a metallic intermediate layer 30.

The auxiliary circuit 16, which is situated in the kerf region of the silicon substrate 10 likewise has a contact device 32, which is embodied as a redistributed contact from a terminal pad 34 of the auxiliary circuit. The construction of the contact device 32 of the auxiliary circuit essentially corresponds to the contact device 26 of the main circuit 12. With regard to the technology of the elastic contact devices 26 and 32, it is possible to resort to the contact and redistribution concepts used in so-called "wafer-level packaging" (WLP).

As is illustrated in FIG. 1, the contact devices 26 and 32 are preferably embodied in an elevated manner relative to the remaining structures of the main and auxiliary circuits, so that the conductive contact bodies 28 of the semiconductor device protrude, i.e. are at the greatest distance from the silicon substrate 10 in the direction of the normal. This makes it easier to move a signal head 36 up to the contact devices 26 and 32 in such a way that only the contact bodies 28 are touched and contact-connected.

FIG. 1 shows the semiconductor device in a state in which a temporary electrical signal connection has been produced between the contact devices 26 and 32 by means of the signal head 36. The BOST structure of the auxiliary circuit 16 is thus in electrical signal connection to a terminal pad 18 of the main circuit 12, so that test commands or signals (a so-called stimulus) can be output from the BOST to the main circuit. When a temporary signal connection exists via the signal head 36, which is preferably a test head of a test system (not illustrated), a functional test of the main circuit can thus be carried out.

If the signal head 36 is removed from the contact bodies 28 of the contact devices 26 and 32, then there is no longer an electrical connection between the main circuit 12 and the auxiliary circuit 16, since said circuits are electrically insulated from one another by the trench 14. When the test method using the BOST of the auxiliary circuit 16 is concluded, the temporary signal connection is interrupted by removing the signal head 36.

A sawing and/or grinding cut which is to be carried out later and isolates the main circuit 12 from the auxiliary circuit 16 accommodated in the kerf region is made in such a way that the sawing edge on the main circuit side is preferably located in the trench 14. The entire auxiliary circuit 16 is preferably removed during the sawing step that is to be carried out. Since the chip edge of the chip thus obtained with the main circuit 12 preferably only has the silicon substrate 10 and no metal tracks, the provision of the auxiliary circuit 16 in the kerf region cannot lead to possible failures of the main circuit 12.

By contrast, the contact device 26 is preserved on the completed chip with the main circuit 12, and can, if appropriate, be used for contact-connection of the main circuit 12 in a later method step.

The use of the elastic contact-connection technology makes it possible simultaneously to contact-connect a large number of contact devices on one or more main and auxiliary circuits at the same time. Consequently, even complex auxiliary circuits having a multiplicity of contact devices can be temporarily connected to corresponding contact devices of the main circuit 12.

Figure 2:
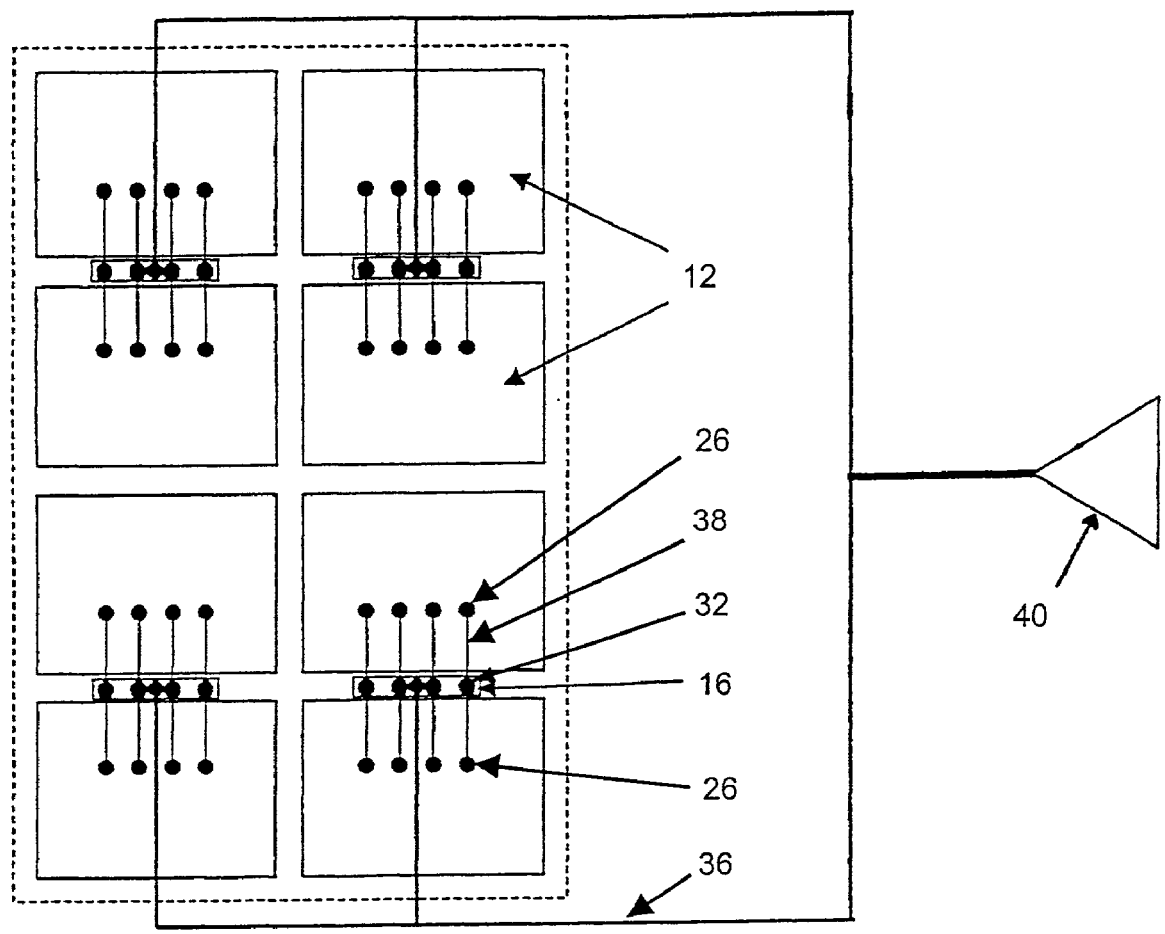
FIG. 2 shows a diagrammatic plan view of a further embodiment of the semiconductor device according to the invention in a cascaded operating arrangement.

FIG. 2 shows a further embodiment of a semiconductor device according to the invention, in which a cascaded operating construction has been realized.

The semiconductor device comprises a multiplicity of integrated main circuits 12 which are accommodated on a single reticle. Two adjacent main circuits 12 in each case share an allocated auxiliary circuit 16 which is arranged in the kerf region between the respective main circuits 12. A signal head 36 (illustrated in fairly diagrammatic form) which is a test head in the present case, can be used to simultaneously produce a large number of temporary electrical signal connections 38 between the main-circuit contact devices 26 and allocated or corresponding auxiliary-circuit contact devices 32.

These temporary electrical signal connections 38 are typically produced by moving the correspondingly configured signal head 36 into proximity with the semiconductor device until contact devices provided on the signal head make electrical contact with respectively allocated contact devices 26, 32 of the main and auxiliary circuits 12, 16.

The signal head 36 furthermore comprises a driver device 40 (not illustrated in any greater detail) which serves for driving the auxiliary circuits 16. The driver device 40 is thus jointly utilized by the four auxiliary circuits 16 illustrated, with the result that a cascaded arrangement is produced. The driver device 40 thus controls the four spatially separate auxiliary circuits 16, which are in each case connected to two of the main circuits 12 via temporary electrical signal connections. Accordingly, in the present embodiment, overall eight main circuits 12 can be addressed via the driver device 40 (or via a single signal head 36).

This embodiment of the semiconductor device according to the invention has proved particularly advantageous for testing main circuits. In this case, the signal head 36 is a test head and the auxiliary circuits 16 are designed as test circuits. Since these test circuits are accommodated in the kerf region of the semiconductor device, they are referred to as BOST circuits. In this case, the main circuits are, for example, memory devices, in particular DRAM components, or else logic chips. The cascaded arrangement of signal head 36, auxiliary circuits 16 and main circuits 12 enables the testing of the main circuits 12 to be effected in a highly parallelized manner. It is thus possible, in an individual test step, to test eight of the main circuit 12 simultaneously using the single test head 36. The associated considerable time optimization in the testing of the semiconductor device is thus manifested advantageously in respect of the production costs thereof.

Having described the invention, and a preferred embodiment thereof, what I claim as new, and secured by letters patent is:

LIST OF REFERENCE SYMBOLS

10 Silicon substrate
12 Main circuit
14 Trench
16 Auxiliary circuit
18 Terminal pad
20 Passivation layer
22 Dielectric layer
24 Interconnect
26 Main-circuit contact device
28 Contact body
30 Intermediate layer
32 Auxiliary-circuit contact device
34 Terminal pad
36 Signal head
38 Temporary electrical signal connection
40 Driver device

The invention claimed is:

1. A method for operating a main circuit of a semiconductor device, the method comprising
   providing a semiconductor device having an integrated main circuit and an integrated auxiliary circuit on a semiconductor substrate, the auxiliary circuit being arranged at a distance from the main circuit in a kerf region of the semiconductor device;
   contact-connecting a contact device of the main circuit and a contact device of the auxiliary circuit to an electrical signal head, thereby producing a temporary electrical signal connection between the contact device of the main circuit and the contact device of the auxiliary circuit;
   outputting and/or receiving electrical signals to and/or from the main circuit by the auxiliary circuit; and
   interrupting the temporary signal connections;
   wherein the electrical signal head comprises a test head of a test system.

2. The method of claim 1, further comprising selecting the electrical signal head to be a test head.

3. The method as claimed in claim 1, further comprising providing a semiconductor device having at least two main circuits and wherein outputting and/or receiving by the auxiliary circuit comprises outputting and/or receiving electrical signals to and/or from the two main circuits.

4. The method as claimed in claim 3, wherein producing the signal connections comprises producing the signal connection between the main circuits and the auxiliary circuit simultaneously.

5. The method as claimed in claim 1, wherein providing a semiconductor device comprises providing a semiconductor device having at least two auxiliary circuits, the auxiliary circuits being designed to jointly utilize a driver device of the signal head.

6. The method as claimed in claim 1, further comprising selecting the main circuit to be a memory circuit, and selecting the auxiliary circuit to be a test circuit and outputting
   and/or receiving the electrical signals comprises testing the memory circuit with the test circuit.

7. The method of claim 6, wherein selecting the main circuit to be a memory circuit comprises selecting the main circuit to be a DRAM.

8. The method as claimed in claim 1 further comprising severing the semiconductor device in the kerf region to separate the main circuit from the auxiliary circuit.

9. The method as claimed in claim 8, wherein severing the semiconductor device comprises destroying the auxiliary circuit.

10. The method of claim 1, wherein contact-connecting the contact devices comprises externally contact-connecting the contact devices.

11. The method of claim 1, wherein the electrical signal head comprises a device external to the semiconductor device.

12. The method of claim 1, wherein contact-connecting the contact devices comprises:
   moving the electrical signal head into the proximity of the contact device of the main circuit and the contact device of the auxiliary circuit; and
   forming an electrical connection between the electrical signal head and the contact devices of the main circuit and the auxiliary circuit.

13. The method of claim 1, wherein interrupting the temporary signal connection comprises removing the electrical signal head from the proximity of the contact device of the main circuit and the contact device of the auxiliary circuit.

14. The method of claim 1, wherein the electrical signal head includes a driver device.

* * * * *